United States Patent [19]

Lerma

[11] 4,227,155
[45] Oct. 7, 1980

[54] AMPLIFIER WITH DARK CURRENT COMPENSATION

[75] Inventor: Jesse P. Lerma, La Habra, Calif.

[73] Assignee: Abbott Laboratories, North Chicago, Ill.

[21] Appl. No.: 933,311

[22] Filed: Aug. 14, 1978

[30] Foreign Application Priority Data

May 31, 1978 [GB] United Kingdom ............... 25100/78

[51] Int. Cl.³ ........................................... H03F 21/00
[52] U.S. Cl. ................................. 330/11; 250/214 A; 330/85; 330/110
[58] Field of Search .................. 330/11, 85, 110, 149; 250/207, 214 A

[56] References Cited

U.S. PATENT DOCUMENTS 3,772,604 11/1973 Hogg et al. ....................... 330/110 X Primary Examiner—James B. Mullins
Attorney, Agent, or Firm—Merriam, Marshall & Bicknell

[57] ABSTRACT

A pre-amplifier for photomultiplier tubes includes means to compensate for the combined dark current and noise output of a photomultiplier tube without inducing a noise dependent offset voltage at the pre-amplifier output. A feedback amplifier and a compensating network, including a capacitor, cooperate to monitor the pre-amplifier output and during this time to maintain the feedback amplifier in a linearly responsive state while charging the capacitor to an amount necessary to clamp the average value of the most negative excursion of the pre-amplifier output to ground.

6 Claims, 3 Drawing Figures

AMPLIFIER WITH DARK CURRENT COMPENSATION

This invention relates to clamping means for amplifiers and more particularly to an amplifier clamping and compensation circuit for restoring the signal ground level of an amplifier output signal having noise present on the signal waveform.

BACKGROUND

In pre-amplifier circuits, there is often a need to amplify and convert a periodic component of an input current signal to a voltage equivalent. Such pre-amplifiers may also be required to block any D.C. component on which the periodic input signal may be superimposed and simultaneously clamp the voltage equivalent output signal to ground.

While these functions may be implemented in a variety of ways, in general such means commonly utilize a DC blocking capacitor followed by a linear amplifier and a diode clamp. Since the blocking capacitor must also pass the input periodic signal being amplified, in the case of low frequency input signals, the capacitance required may assume prohibitively large values. Such low frequency input signals are commonly encountered in photometric applications for bichromatic analysis in which a light beam is mechanically interrupted or chopped at a relatively low periodic rate and thereafter converted by a photomultiplier tube to a corresponding signal for processing and analysis.

Pre-amplifiers currently in use for such photometric applications have eliminated the need for a DC blocking capacitor. Present feedback amplifiers sample the photomultiplier dark current signal level, i.e., the quiescent direct current level of the photomultiplier tube (PMT) signal output.

This DC level is used in the feedback network to charge a capacitor through a diode and resistor combination in a direction to remove the offset voltage due to the dark current signal present at the output of the PMT pre-amplifier. The feedback amplifier is normally in a state of positive saturation, with brief, uncontrolled excursions through its linear operating region, at times ending in negative saturation, with equally uncontrolled return excursions to positive saturation. The highly non-linear, frequency independent response of the feedback network results in an undesirable overall response to input noise. Because of the overall circuit configuration, increasing the network's response time inevitably leads to other more disastrous trade-offs.

The feedback network is thus incapable of frequency discrimination and output noise is processed exactly like the signal. As a result, the most negative excursion of signal plus noise at the output of the pre-amplifier is clamped to ground. This induces a noise dependent offset voltage in the pre-amplifier output signal. It is a characteristic of photomultiplier tubes that their noise level changes as a function of increasing tube operating voltage. Since the voltage applied to the photomultiplier tube is a function of the absorbance value to be measured during bichromatic analysis, the noise dependent offset voltage at the output of the pre-amp inevitably leads to non-linearity measurement errors whose magnitude is related to the noise characteristics of the photomultiplier tube Thus, in the past, in order to minimize the error due to the noise dependent offset voltages, it was required to pre-test and therefore pre-select the photomultiplier tubes having a low range of noise level changes. Under normal circumstances, the rejection rate of new photomultiplier tubes in order to meet this criteria amounted to 50-60%.

It is therefore desirable to provide a pre-amplifier able to restore ground in the presence of noise, and particularly one capable of compensating for the dark current output of a photomultiplier tube without requiring time consuming and costly pre-testing of photomultipliers to determine those having a desired low range of noise level changes.

SUMMARY OF THE INVENTION

In accordance with the principles of the present invention, there is provided a pre-amplifier for photomultiplier tubes which includes means to compensate for the dark current output of the photomultiplier tube without inducing a noise dependent offset voltage at the pre-amplifier output. A compensating network cooperating with a feedback amplifier accurately clamps the average value of the most negative excursion of the output of the pre-amplifier to ground. This action assures optimum ground restoration of the output signal in the presence of noise. The feedback amplifier is coupled intermediate the compensating network and the output of the pre-amplifier with the output of the compensating network being coupled to the pre-amplifier input.

During the dark current portion of the photomultiplier tube output signal, the feedback amplifier and a lead/lag compensating network combine to monitor the output of the pre-amplifier. During this time the feedback amplifier is maintained in a linearly responsive state and a capacitor, included in the lead/lag compensator, is charged to an amount of feedback correction necessary to accurately clamp the average value of the most negative excursion of the preamplifier output to ground. The resistor and capacitor components of the lead/lag compensator are selected to optimize the network signal response with respect to rise time, overshoot and stability. During other signal portions, when active ground restoration is not desired, the feedback amplifier is caused to saturate and therefore cease its monitoring function.

Accordingly, the compensated pre-amplifier of the present invention includes means to stabilize its feedback response to assure optimum ground restoration of its output signal in the presence of noise, thereby eliminating the noise dependent offset voltage present in such prior art pre-amplifiers.

BRIEF DECRIPTION OF THE DRAWINGS

DETAILED DESCRIPTION

Figure 2:
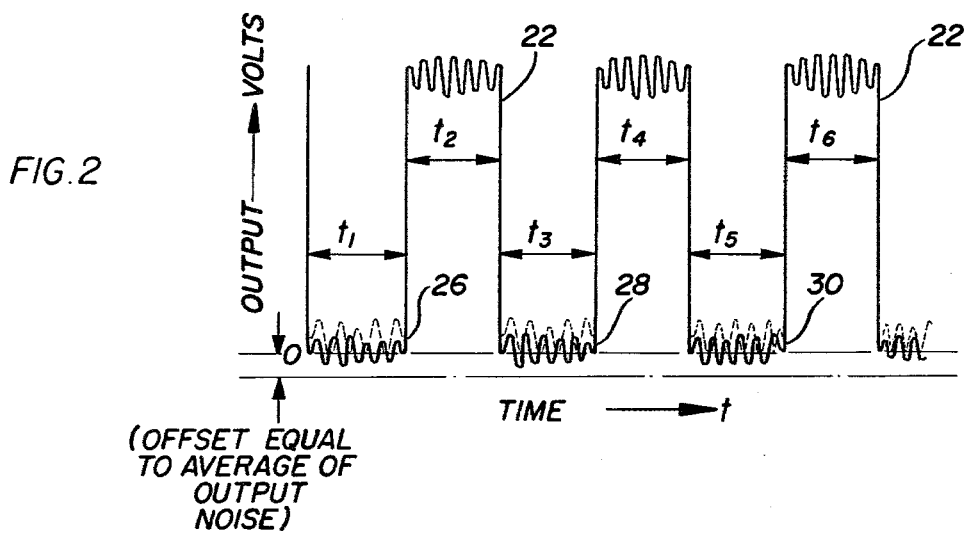
FIG. 2 illustrates the output signal waveform with ground restoration in the presence of noise indicated in solid lines and the prior art results of an offset voltage in the signal due to noise indicated in dashed lines.

Initially, with reference to FIG. 2, the dashed lines illustrate the offset voltage induced by prior art pre-amplifier/compensating networks. As previously explained, such prior art circuits clamped the most negative excursions of the output signal plus noise to ground thereby producing the noise dependent offset voltage indicated in FIG. 2. On the other hand, the amplifier with compensation in accordance with the present invention restores an optimum ground condition to the signal. This is illustrated in the solid lines of FIG. 2. In accordance with the present invention, a feedback network is incorporated with the amplifier to accurately clamp the average value of the most negative excursion of the output due to noise to ground.

Figure 1:
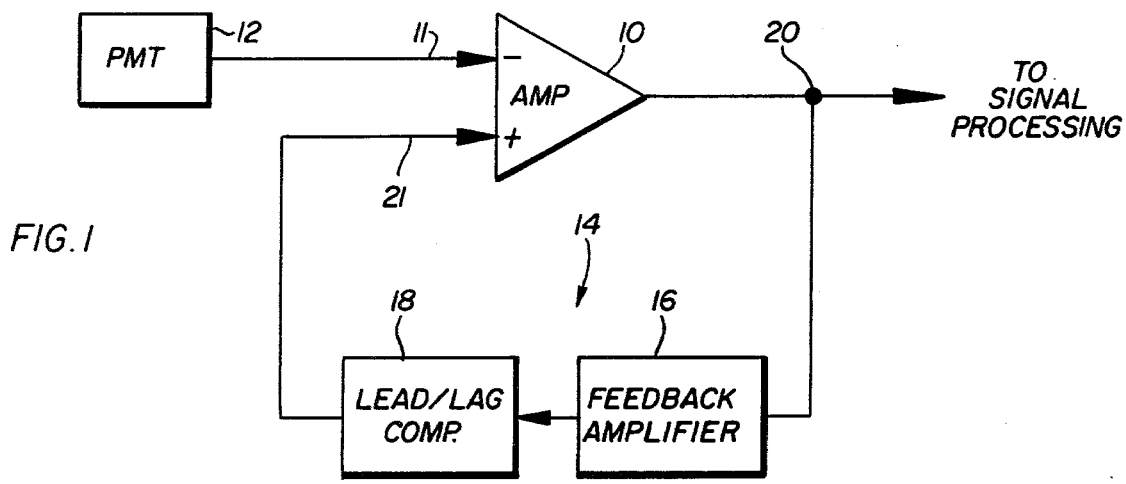
FIG. 1 is a block diagram of an amplifier circuit with means for restoring the ground signal in the presence of noise in accordance with the principles of the present invention.

Referring now to FIG. 1, there is illustrated a pre-amplifier 10 having its inverting input 11 coupled to the output of a photomultiplier tube (PMT) 12. A feedback network 14 including a feedback amplifier 16 and a lead/lag compensating circuit 18 is coupled between an output terminal 20 and a non-inverting input 21 to pre-amplifier 10. The feedback induced by network 14 stabilizes the overall feedback response to assure the output signal derived from the photomultiplier tube 12 is optimally restored to ground in the presence of PMT output signal noise during its dark current signal portion.

In particular, the feedback network 14 monitors the pre-amplifier output signal at terminal 20 only during the PMT dark current signal portion. Feedback amplifier 16 is maintained linearly responsive during the PMT dark signal portion and is thus able to sample the output signal at terminal 20, and through the lead/lag compensating circuit 18 develop a voltage supplied to the amplifer 10 sufficient for feedback correction.

Figure 3:
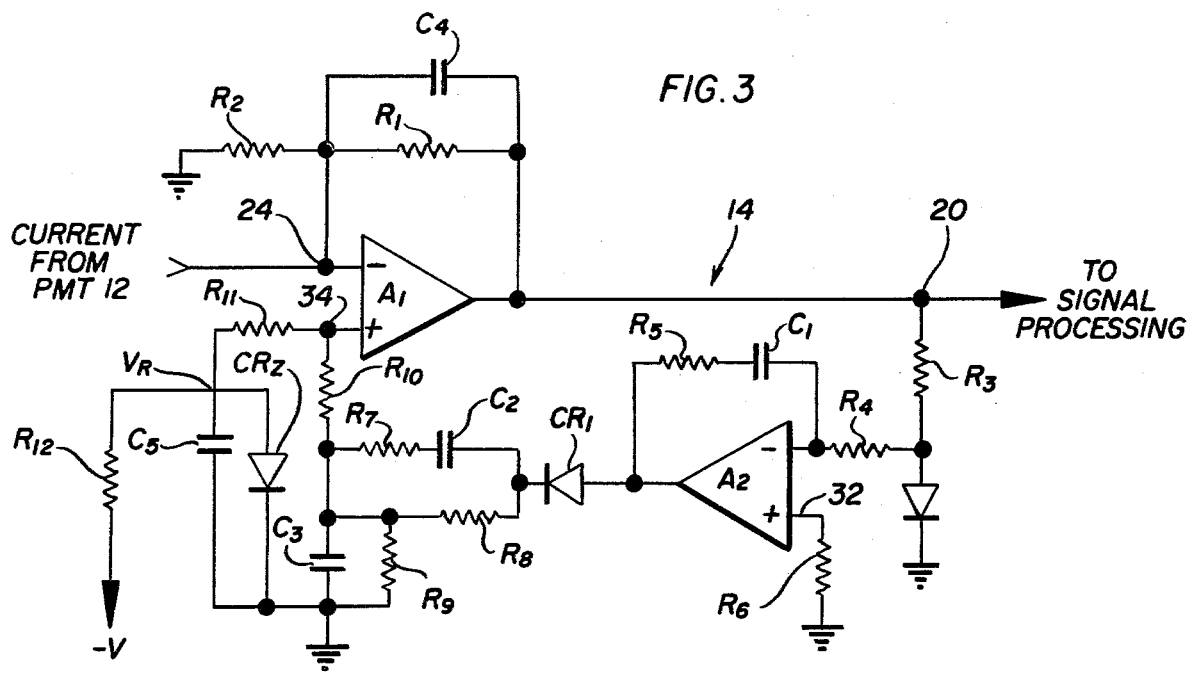
FIG. 3 is a schematic diagram illustrating the components and their interconnections corresponding to the block diagram of FIG. 1.

Referring now to FIG. 3, there is illustrated in detail the components forming the apparatus shown in the block diagram of FIG. 1. As will be described in more detail hereinafter, the components forming the feedback amplifier 16 and lead/lag compensating network 18 enable the amplifier $A_2$ to monitor the output of amplifier $A_1$ at terminal 20 only during the time intervals $t_1$, $t_3$ and $t_5$ as noted on the waveform shown in FIG. 2. During these time intervals, the amplifier $A_2$ is operating in its linearly reponsive state to charge capacitor $C_3$ with an amount of feedback correction necessary to clamp the average value of the most negative excursions of the output of amplifer of $A_1$ to ground as shown in FIG. 2. FIG. 2 therefore illustrates the output signal waveform 22 present at the output terminal 20 as indicated in solid lines. Also for purposes of illustration, the dashed lines in FIG. 2 represent the noise present during the dark current portion of the photomultiplier tube 12 as previously described.

In the time intervals $t_2$, $t_4$ and $t_6$ indicated on the output signal 22 as shown in FIG. 2, amplifier $A_2$ is placed in negative saturation, thereby causing it to cease its monitoring function during the aforementioned time intervals. Thus, the feedback network 14 is cycled between monitoring time intervals $t_1$, $t_3$ and $t_5$ to restore an optimum ground to the output signal 22 in the presence of noise, and non-monitoring time intervals $t_2$, $t_4$ and $t_6$. Also, during the monitoring cycles, amplifier $A_2$ is in a linearly responsive state, whereas during the non-monitoring time intervals amplifier $A_2$ is in a saturated condition. Thus, in general there has been provided an amplifier including means to stabilize its feedback response to assure optimum ground restoration of its output signal in the presence of noise.

A specific embodiment of the present invention is set forth in FIG. 3. In the preferred embodiment of the invention as shown therein, the feedback network 14 is used to clamp the average value of the most negative excursion of the output of amplifier $A_1$ to ground. Amplifier $A_1$, including resistors $R_1$, $R_2$ and capacitor $C_4$ acts as a preamplifier of the output signals from photomultiplier tube 12 supplied to the signal inverting input terminal 24. While the following description of the present invention is applied to an amplifier for photomultiplier tube output signals, it is to be understood that the invention is not so limited, and as previously indicated, may be used in other applications as well to assure optimum ground restoration of an output signal in the presence of noise. Therefore, the specific illustration of the components in the photomultiplier tube environment shown in FIG. 3, is merely to illustrate one application of the present invention.

With respect to FIG. 3, amplifier $A_1$ operates as a current to voltage converter for the periodic component of the input signal from the photomultiplier tube (PMT) 12. The output of amplifier $A_1$ is monitored by the stage gain characteristics of amplifier $A_2$. At DC the gain of amplifier $A_2$ is equal to the open loop gain of amplifier $A_2$ due to capacitor $C_1$.

A high degree of gain at DC is a desirable attribute to enable the feedback network to accurately clamp the average value of the most negative excursion of the output of amplifier $A_1$ to ground. At other than DC the stage gain of amplifier $A_2$ is quickly rolled off by feedback resistor $R_5$ to a stable value of stage gain determined by $R_5$, $R_4$, and $R_3$ calculated to cause amplifier $A_2$ to saturate negatively for positive excursions of the output of amplifier $A_1$. The entry of amplifier $A_2$ into negative saturation is a design requirement so as to cause amplifier $A_2$ to cease its monitoring function since the most negative portion of the output of amplifier $A_1$ has been completed, as evidenced in FIG. 2 by the positive swing starting at points 26, 28, and 30 at the output of amplifier $A_1$.

Prior to $A_2$ entering negative saturation, capacitor $C_3$ is charged at a rate governed by the output of amplifier $A_2$ through diode $CR_1$ and resistor network $R_8$ and $R_9$ in a direction to clamp the output of amplifier $A_1$ to the ground reference supplied to the non-inverting terminal 32 of amplifier $A_2$ through bias compensation resistor $R_6$. Linear operation of amplifier $A_2$ is assured through the use of its local feedback and lead network $R_7$ and $C_2$. The circuit configuration represented by $R_7$, $C_2$, $R_8$, $R_9$ and $C_3$ is commonly referred to as a lead/lag compensator and is frequently used in closed loop servo design as a means to optimize overall response with respect to rise time, overshoot and stability. The design of such networks is well documented and presents no undue restriction to those knowledgeable in the field.

During that portion (time intervals $t_1$, $t_3$, $t_5$) of the output signal waveform 22 in which amplifier $A_2$ is actively clamping the output of amplifier $A_1$, capacitor $C_3$ is serving a dual role, that is, as a component of the lead/lag network and as the eventual memory element of the overall pre-amplifier when the output of amplifier $A_1$ begins its positive excursion leading to the subsequent negative saturation of amplifier $A_2$. As amplifier $A_2$ approaches negative saturation, diode $CR_1$ prevents the saturation state of amplifier $A_2$ from influencing the charge on capacitor $C_3$. Since the voltage across capacitor $C_3$ is at all times communicated to the non-inverting signal input terminal 34 of amplifier $A_1$ through resistor $R_{10}$ and since the voltage on capacitor $C_3$ represents the amount of feedback correction deemed necessary by amplifier $A_1$ during its linearly responsive state, the output of amplifier $A_1$ continues to undergo the same level of correction during the saturation state of amplifier $A_2$ subject to the restriction that capacitor $C_3$ does not discharge appreciably before the next linearly responsive state of amplifier $A_2$.

In order to insure adequate dynamic range of amplifier $A_2$ and to insure that diode $CR_1$ is caused to conduct during the entire interval in which amplifier $A_2$ is linearly responsive, the operating point of amplifier $A_2$ is controlled by reference voltage $V_R$ acting through resistor $R_{11}$. Assuming that resistors $R_{10}$ and $R_{11}$ are of equal resistance, the voltage charge on capacitor $C_3$ must be equal and of opposite polarity to reference voltage $V_R$. The reference voltage $V_R$ is maintained at a substantially constant level by means of Zener diode $CR_2$, resistor $R_{12}$ and capacitor $C_5$ coupled to the indicated voltage source.

Since the voltage at the cathode end of diode $CR_1$ bears a fixed DC relationship through resistors $R_8$ and $R_9$ to the voltage present on capacitor $C_3$, it can be seen that an optimum operating point for amplifier $A_2$ can be specified to lie at a point midway between the voltage on capacitor $C_3$ and its positive saturation limit. In this manner, amplifier $A_2$ is kept from clipping on noise peaks.

The lead portion of the lead/lag network in the feedback path in addition to the role played in optimizing the rise time and stability of the circuit provides a high frequency roll-off characteristic to the closed-loop response which, in conjunction with capacitor $C_4$, minimizes the high frequency noise output of the compensated amplifier circuit.

The foregoing detailed description has been given for clearness of understanding only, and no unnecessary limitations should be understood therefrom as modifications will be obvious to those skilled in the art.

What is claimed is:

1. In a pre-amplifier for multilevel, pulsed electrical signals, said signals having a direct current signal component in the presence of noise and undulating between levels with respect to ground, wherein the improvement comprises:

a feedback amplifier coupled to said signal at the output of said pre-amplifier to monitor said pre-amplifier output;

a compensating circuit coupled intermediate said feedback amplifier and said pre-amplifier input;

said feedback amplifier and said compensating circuit including means for enabling said feedback amplifier to monitor said pre-amplifier output and to operate in a linearly responsive state during levels of said multi-level, pulsed signal closest to ground for clamping the average value of said noise to ground, thereby restoring optimum ground to said output signal;

said compensating circuit including a capacitor, means for charging said capacitor through said feedback amplifier during its linearly responsive state to transfer a compensating charged voltage level to said pre-amplifier input sufficient to compensate for the average value of said noise with respect to ground, and saturation means coupled to said feedback amplifier for enabling said feedback amplifier to saturate during other levels of said multi-level, pulsed signal and thereby cease monitoring of said pre-amplifier output.

2. The improvement of claim 1, including means coupled to said capacitor for enabling transfer of said compensating charged voltage level to said pre-amplifier input during feedback amplifier saturation.

3. The improvement of claim 2, including a diode coupled intermediate the output of said feedback amplifier and said capacitor for preventing appreciable discharge thereof during feedback amplifier saturation.

4. A photomultiplier tube pre-amplifier for compensating for the combined dark current output and noise of a photomultiplier tube without inducing a noise dependent offset voltage at the pre-amplifier output, said pre-amplifier comprising:

a first amplifier having an input coupled to said photomultiplier output for receiving said combined dark current and noise output;

a feedback amplifier having an input coupled to said first amplifier output to monitor said first amplifier input;

a compensating circuit intermediate said feedback amplifier and said first amplifier input;

said feedback amplifier and said compensating circuit including means for enabling said feedback amplifier to monitor said first amplifier output and to operate in a linearly responsive state during the presence of said combined dark current and noise to clamp the average value of the peak excursions of noise present at said first amplifier output to ground;

said compensating circuit including a capacitor, means for charging said capacitor through said feedback amplifier during its linearly responsive state to transfer a charged voltage level to said first amplifier input sufficient to compensate for the average value of said noise with respect to ground, and saturation means coupled to said feedback amplifier for enabling said feedback amplifier to saturate during other levels of said multi-level, pulsed signal and thereby cease monitoring of said first amplifier output.

5. A photomultiplier pre-amplifier according to claim 4, including means coupled to said capacitor for enabling transfer of said compensating charged voltage level to said first amplifier input during feedback amplifier saturation.

6. A photomultiplier pre-amplifier according to claim 5, including a diode coupled intermediate the output of said feedback amplifier and said capacitor for preventing appreciable discharge thereof during feedback amplifier saturation.

* * * * *